United States Patent
Korchemny et al.

(10) Patent No.: US 11,188,695 B2
(45) Date of Patent: Nov. 30, 2021

(54) UNIFIED FUNCTIONAL COVERAGE AND SYNTHESIS FLOW FOR FORMAL VERIFICATION AND EMULATION

(71) Applicant: Synopsys, Inc., Mountain View, CA (US)

(72) Inventors: Dmitry Korchemny, Kfar Saba (IL); Ashok Kumar Bhatt, Uttar Pradesh (IN); Eduard Rudolf Cerny, Worcester, MA (US); Hanish Singla, Uttar Pradesh (IN)

(73) Assignee: Synopsys, Inc., Mountain View, CA (US)

( * ) Notice: Subject to any disclaimer, the term of this patent is extended or adjusted under 35 U.S.C. 154(b) by 601 days.

(21) Appl. No.: 16/058,157

(22) Filed: Aug. 8, 2018

(65) Prior Publication Data

US 2019/0050516 A1 Feb. 14, 2019

(30) Foreign Application Priority Data

Aug. 11, 2017 (IN) .............................. 201741028556

(51) Int. Cl.
*G06F 30/30* (2020.01)
*G06F 30/331* (2020.01)
*G06F 30/3323* (2020.01)

(52) U.S. Cl.
CPC ............ *G06F 30/30* (2020.01); *G06F 30/331* (2020.01); *G06F 30/3323* (2020.01)

(58) Field of Classification Search
CPC ..... G06F 30/30; G06F 30/331; G06F 30/3323
See application file for complete search history.

(56) References Cited

U.S. PATENT DOCUMENTS 7,502,728 B1 * 3/2009 Hurlock ........... G01R 31/31707
    703/23
8,413,088 B1 * 4/2013 Armbruster ............. G06F 30/33
    716/106

OTHER PUBLICATIONS

A. Cheng, C. Yen and J. Jou, "A formal method to improve SystemVerilog functional coverage," 2012 IEEE International High Level Design Validation and Test Workshop (HLDVT), Huntington Beach, CA, USA, 2012, pp. 56-63, doi: 10.1109/HLDVT.2012.6418243.*

B. Kapoor, "An efficient method for computing exact path delay fault coverage," Proceedings the European Design and Test Conference. ED&TC 1995, Paris, France, 1995, pp. 516-520, doi: 10.1109/EDTC.1995.470352.*

Cheng, A-C. et al., "A Formal Method to Improve System Verilog Functional Coverage," 2012 IEEE International High Level Design Validation and Test Workshop (HLDVT), IEEE, 2012, pp. 56-63.

(Continued)

*Primary Examiner* — Saif A Alhija
(74) *Attorney, Agent, or Firm* — Fenwick & West LLP (57) ABSTRACT

Synthesis of functional coverage (e.g., covergroups) is optimized for hardware emulation. The optimization may reduce the number of logic gates used to implement the hardware emulator circuits or reduce the computer resources used to synthesize the hardware emulator circuits. The optimization may also prevent the synthesis of unnecessary circuits. In another aspect, the optimization may result in a representation that may be used both to synthesize hardware emulation circuits and as part of formal verification. This may result in a model that can be used for formal verification, hardware emulation, and software simulation.

17 Claims, 5 Drawing Sheets

(56) References Cited

OTHER PUBLICATIONS

Van der Shoot, H et al., "UVM and Emulation: How to Get Your Ultimate Testbench Acceleration Speed-up," Design and Verification Conference and Exhibition, Europe, DVCON 2015, 2015, pp. 1-16.

IEEE Standard for SystemVerilog-Unified Hardware Design, Specification, and Verification Language, IEEE Std 1800™-2012 (Revision of IEEE Std 1800-2009), IEEE Computer Society and the IEEE Standards Association Corporate Advisory Group, IEEE Standards Association, Feb. 21, 2013, 1315 pages.

Geometric Tools: Boolean Operations on Intervals and Axis-Aligned Rectangles David Eberly, Geometric Tools, LLC, undated, 1 page, [Online] [Retrieved on Sep. 19, 2018] Retrieved from the Internet<URL:http://www.geometrictools.com/>.

Faulhaber, J. "Interval Container Library [Boostlcl]," 2010-2011, [Online] [Retrieved on Sep. 19, 2018] Retrieved from the Internet<URL:http://www.herold-faulhaber.de/.

\* cited by examiner

UNIFIED FUNCTIONAL COVERAGE AND SYNTHESIS FLOW FOR FORMAL VERIFICATION AND EMULATION

CROSS-REFERENCE TO RELATED APPLICATION(S)

This application claims priority to Indian Provisional Patent Application Serial No. 201741028556, "Unified Functional Coverage and SVA Synthesis Flow for Emulation and Formal Verification," filed Aug. 11, 2017. The subject matter of all of the foregoing is incorporated herein by reference in their entirety.

BACKGROUND

1. Technical Field

This disclosure relates to functional coverage collection in hardware emulation and formal verification.

2. Description of Related Art

During functional coverage collection in hardware emulation for a signal (i.e., a net or a variable) or integral expressions of signals in a circuit design, a designer may want to understand how many times the signal or expression assumed a particular value, how many times the signal or expression had a value falling within some particular range or ranges, or how many times specific transitions occurred. In formal verification, a design is tested for attainability of the specified coverage events (i.e., whether specific conditions or transitions are coverable). If formal verification shows that the design cannot show an event (e.g., a signal having a particular value), there is no point in testing the design in a hardware emulation or simulation environment for that event.

For functional coverage, the designer may specify many conditions for various signals and combinations of signals, and each of these conditions may be defined by a bin. When the condition specified by the bin is met, a counter associated with the bin is incremented. Hardware emulation has memory limitations that make it difficult to implement many counters. The counters must be synthesized in hardware, and the number of counters in a straightforward implementation can be too many for a real-life coverage specification. This causes an overflow of the hardware, which requires more hardware or makes the hardware more expensive to accommodate this increase. Hardware capacity overhead, in turn, negatively affects emulation performance. In addition, straightforward synthesis algorithms may result in a compilation blowup because of the large volume of intermediate data, even if the volume of the final data used in emulation is feasible.

Formal verification, on the other hand, has time limitations. Running a formal verification process is very time consuming and, if it is inefficient, the formal verification may not finish in a reasonable time.

Thus, there is a need for approaches to improve the synthesis of functional coverage for hardware emulation and the analysis of functional coverage by formal verification.

SUMMARY

The present disclosure overcomes the limitations of the prior art by improving the synthesis of functional coverage for hardware emulation. The approaches described herein provide an implementation for coverage synthesis. The implementation may provide a model that can be used for formal verification, hardware emulation, and software simulation.

According to one method, a definition of functional coverage of a digital circuit of interest is received. The definition includes a set of bins. The definition of the functional coverage is expressed in a hardware verification language. In the following examples, SystemVerilog will be used, but the disclosure is not limited to SystemVerilog. Examples of bins include range bins, transition bins and cross bins. They may be defined using syntax such as bins, bins [ ], ignore_bins, illegal_bins, and cross. Wildcards may also be used. The bins are synthesized as bin indicator circuits, which are suitable for use on a hardware emulator. Bin indicator circuits produce an output that indicates whether the bin is currently active during emulation. The output of a bin indicator circuit may feed a counter, which then counts the number of times a bin is hit during emulation.

However, the bins are not synthesized directly from their original definitions. Instead, the definition of the functional coverage is converted to a form that facilitates synthesis of the bins, and the bin indicator circuits are synthesized from these optimized forms. For example, the optimization may reduce the number of logic gates used to implement the bin indicator circuits or reduce the computer resources used to synthesize the bin indicator circuits. The optimization may also prevent the synthesis of unnecessary bin indicator circuits, for example for values or bins that are empty, ignored, illegal or not reachable during emulation. In some cases, it is possible to efficiently convert bin definitions into concurrent assertions or cover statements and reuse the synthesis for these statements.

Other aspects include components, devices, systems, improvements, methods, processes, applications, computer readable mediums, and other technologies related to any of the above.

BRIEF DESCRIPTION OF THE DRAWINGS

Embodiments of the disclosure have other advantages and features which will be more readily apparent from the following detailed description and the appended claims, when taken in conjunction with the examples in the accompanying drawings, in which:

DETAILED DESCRIPTION OF THE PREFERRED EMBODIMENTS

The figures and the following description relate to preferred embodiments by way of illustration only. It should be noted that from the following discussion, alternative embodiments of the structures and methods disclosed herein will be readily recognized as viable alternatives that may be employed without departing from the principles of what is claimed.

SystemVerilog Coverage Terminology

Functional coverage of a digital circuit may be defined using coverage items, such as coverpoints and cross coverage items. In one approach, coverage items based on the same clocking event are grouped together into covergroups. The covergroup determines, either expressly or implicitly, the clocking event used to sample the expressions of interest. Here, the term "expression" or "integral expression" includes both the native signals in the digital circuit, as well as integral expressions that are a function of those signals. The covergroup includes a coverpoints and/or cross coverage items. Each covergroup defines the conditions of interest for a particular integral expression.

The conditions of interest are defined in bins contained in each coverpoint or cross coverage item. Each coverpoint includes a group of one or more bins that specify a set of values or transitions of the integral expression covered by that coverpoint (i.e., the conditions of interest). Range bins specify a set of values of interest. Transition bins specify a set of transitions of interest. A covergroup may also include cross coverage items, which include cross bins. Cross bins are bins for cross products between two or more coverpoints in the covergroup.

The following example illustrations are described in SystemVerilog coverage terminology. In other embodiments, the techniques described herein can be implemented in systems that use other hardware description and verification languages.

Below is an example definition of a covergroup cg that includes three coverpoints cp1, cp2 and cp3, and a cross coverage item cr. In SystemVerilog, the covergroup syntax is used to define covergroups. coverpoint and cross are used to define coverpoints and cross coverage items, respectively.

```
logic [7:0] expr1, expr2, expr3;
covergroup cg @(posedge clk);
    cp1: coverpoint expr1 {
        bins a = {[1:3], [10:17]};
        bins b[ ] = {[2:4]};
        wildcard bins c = {8'b11??000?};
        ignore_bins ignore_vals = {7,8};
    }
    cp2: coverpoint expr2 {
        bins d = {1};
        bins e = {2, 4};
    };
    cp3: coverpoint expr3 {
        bins f = (7 => 8);
    }
    cr: cross cp1, cp2 {
        x1: binsof(cp1 intersect {2})
    };
endgroup : cg
```

In the above example, the covergroup cg is sampled on posedge clk. That is, bin hits are counted only on posedge clk, where clk is a clock. The covergroup cg includes coverpoints cp1, cp2 and cp3, and cross coverage item cr. The coverpoints cp1, cp2 and cp3 define conditions of interest with respect to the integral expressions expr1, expr2 and expr3, respectively. As described previously, these expressions may be individual signals from the digital circuit of interest or expressions based on multiple signals. Each coverpoint defines various bins for the expression covered by that coverpoint. The bins are defined using bins, wildcard bins, ignore_bins, etc.

In coverpoint cp1, bin a is a range bin that is hit when expr1 has a value 1, 2, 3, or 10, 11, . . . , 17. The [ ] in the definition of bin b denotes that it is an array bin, which is a shorthand notation for defining multiple range bins in a single construct. Here, the notation defines three bins b[0], b[1] and b[2], which are hit when the value of expr1 is 2, 3 or 4, respectively. Bin c is another range bin but defined using wildcards. It is hit when expr1[7:6]==2'b11 and expr1[3:1]==3'b000, whereas no restriction is imposed on other bits of expr1. The ignore_bins ignore_vals notation means that when expr1 has values 7 or 8, no bin hit should be registered for this coverpoint.

In coverpoint cp3, bin f is a transition bin. It is hit when expr3 changes its value from 7 to 8 at the two consecutive cycles of the covergroup clocking event.

cr is a cross coverage item. The bins in this cross coverage item are based on the cross products of the two coverpoints cp1 and cp2. It has one explicit cross bin x1, which is hit whenever any bin of cp1 containing a value of 2 is hit (i.e., either a or b[0]). It also includes a set of implicit cross bins, one for each pair of bins in cp1 and cp2, but excluding pairs that belong to any explicit cross bin. In this example, the implicit cross bins of cr are all pairs of bins of cp1 and cp2, except (a, d), (a, e), (b[0], d) and (b[0], e). Each implicit cross bin is hit when both bins of the pair are hit simultaneously.

Synthesis of Bin Indicator Circuits

In hardware emulation, the functional coverage defined by a covergroup is probed by hardware circuits. For convenience, these may be referred to as emulation circuits to distinguish them from the digital circuit that is being analyzed. Bins in the covergroup definitions may be synthesized as bin indicator circuits that feed bin hit counters. The bin indicator circuit is synthesized from the bin definition, and it indicates when the corresponding bin is active (e.g., output 1 when the bin is hit and 0 otherwise). The following sections give examples of how the bin indicator circuit may be synthesized for different types of bins.

To collect the number of hits, a counter is synthesized for a bin. This bin hit counter is incremented each time the clocking event occurs and the bin indicator circuit has value 1. The bin indicator circuit indicates that the coverage condition holds. Thus, if the bin indicator circuit is ind, its counter is ctr, and the covergroup is clocked by posedge clk, then the hit counter may be synthesized as follows.

int unsigned ctr=0;
always @(posedge clk iff ind) ctr <=ctr+1;

We define here counter type as int unsigned, but it may have any other type appropriate for the implementation. When a coverpoint and a bin have an associated iff construct, say iff_cp and iff_cb, these iff conditions are conjoined with the bin indicator circuit:

ind && iff_cp && iff_cb;

For formal verification purposes, it may be necessary to detect only if the bin has ever been hit or not. In that case, a one-bit persistent hit indicator is sufficient:

bit hit=1'b0; always @(clk iff ind) hit <=1'b1;

As described above, synthesizing an emulator circuit for the covergroup or synthesizing bin indicator circuits directly from the original definitions expressed in the hardware verification language may be less than optimal. For example, the resulting circuits may contain more logic gates than necessary, or the synthesis process may consume more compute resources than necessary.

Figure 1:
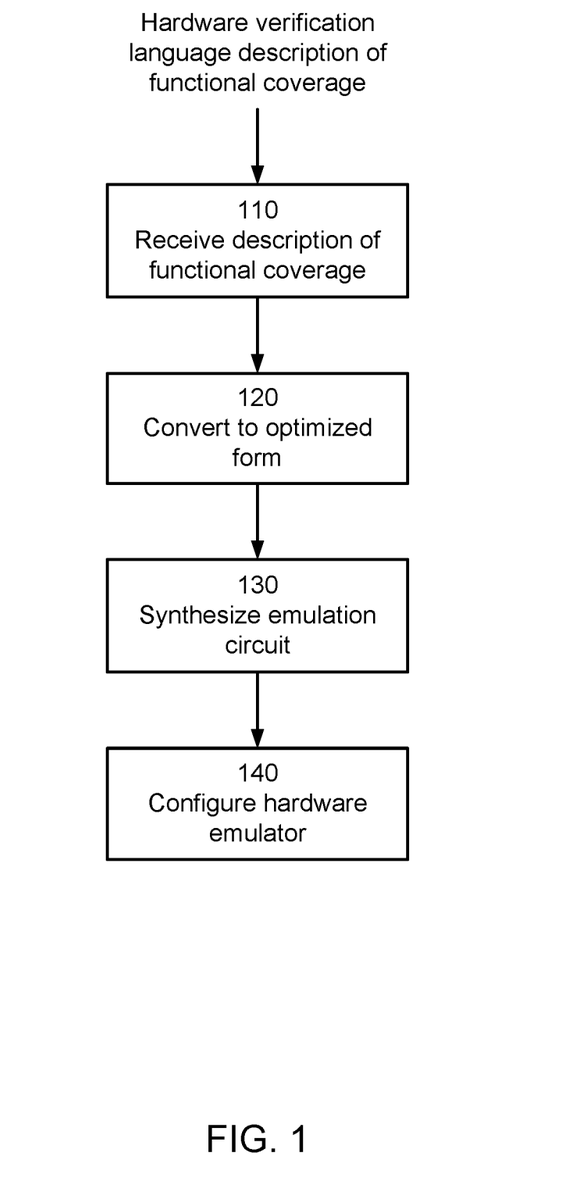
FIG. 1 is a flow diagram for synthesizing covergroups for a hardware emulator.

FIG. 1 is a flow diagram of a more efficient approach to synthesizing an emulation circuit for functional coverage. In this example, the functional coverage is specified by a covergroup. The definition of the covergroup is provided 110 in hardware verification language. However, rather than synthesizing circuits based directly on this definition, the internal description of the covergroup is first converted 120 to a form that is optimized for synthesis. Some examples are given below. In many of the following examples, the optimization facilitates the synthesis of bins as bin indicator circuits. For example, the optimized form may reduce the number of logic gates compared to synthesis of the unoptimized form, the synthesis process for the optimized form may use less memory or other compute resources compared to synthesis of the unoptimized form, or the optimized form may avoid the synthesis of void bins or for expression values that are ignored, illegal or not reachable during emulation. Here, "optimized" means the form is better than before, but it does not have to be optimal (i.e., the very best that is possible).

The bins are then synthesized 130 from the optimized form, rather than directly from the original definition in hardware verification language. The bin indicator circuits and counters may then be implemented 140 on the hardware emulator. In some cases, the bins are synthesized as RTL, and then physical synthesis is applied to the RTL to produce the physical implementation (e.g., FPGA configuration data). In other cases, the bins may be synthesized directly to the physical form. Various examples are described below.

Range Bins

The straightforward way to synthesize range bins is to check that their coverpoint expression belongs to the set of values specified by the bin. For example, for a bin
   bins a={[0:62], 65};
in a coverpoint for expression cp, the bin indicator circuit may be synthesized into RTL as:
   assign ind=cp inside {[0:62], 65};
The problem with this straightforward approach is that the ranges may be adjacent or overlap, such as {[0:62], 63}. This will result in redundant logic if synthesized directly from this form. Instead, adjacent and/or overlapping ranges of values specified in the range bin are merged in an optimized form of the range bin, and then synthesized. This simplifies the range expression to {[0:63]} in this example and avoids the synthesis of redundant logic.

The situation becomes more acute in the presence of ignore_bins and bin arrays. Without appropriate optimizations, many void bins may be generated, introducing significant capacity and performance overhead. Consider the following trivial example:
   bins b[ ]={[3:15]};
   ignore_bins ign={[5:20]};
Only bins b[0]={3} and b[1]={4} need be synthesized. The remaining bins defined in the bins b[ ] construct are eliminated by the ignore_bins operator.

We use interval tree logic to derive the optimized form for bins, by optimizing the bin representation and by removing values that are specified as ignored or as illegal. The number of range intervals may be further reduced by merging intersecting and adjacent ranges. For example, given a bin defined by range {[2:4], [4:9]} and an ignore_bins range [6:7], the set of values for the resulting bin is rewritten in a more optimized form as {[2:5], [8:9]}. No circuits are synthesized for the values 6 and 7, because these ignored values have been removed from the optimized representation of the bin.

If the set of values for a bin reduces to the empty set, then that bin may be removed entirely during optimization. For example, given a bin defined by range [4:6] and the ignore range [3:8], the resulting set of values for this bin is the empty set. No bin indicator circuit is synthesized for this void bin. A bin with an empty set of values may be the result of ignore bins or illegal bins. In another variation, the bin may contain some values, but those values may not be reachable (e.g., as determined by formal verification). Those bins also need not be synthesized.

Bins Defined Using Wildcards

In the case where in a coverpoint there is a range bin and an ignore or illegal bin is a wildcard bin, or vice versa, e.g., [26:31] and 5'b?1?00, formal methods (e.g., BDD or SAT) may be used to determine whether their difference is non-empty by checking the satisfiability of condition 26<=x && x<=31 && x[3] && !x[1] && !x[0], where x has the type of bit [4:0]. If the bin is empty, it need not be synthesized.

Cross Bins

Referring to FIG. 1, the functional coverage could also include cross coverage items. The syntax of cross coverage items which cover cross products between two or more coverpoints, allows defining huge coverage spaces in a concise manner, which can result in a memory explosion during the synthesis, let alone during emulation and formal verification. Naive synthesis of explicit cross bins leads to a large capacity overhead. As far as implicit cross bins are concerned, sometimes the actual coverage space is rather small, but the straightforward synthesis will require building a huge intermediate space. Subsequently, this space will be reduced significantly. The following approaches provide for more efficient synthesis of explicit bins and for avoiding or reducing such intermediate blowups for implicit cross bins. Note that according to SystemVerilog semantics, implicit cross bins are blasted into individual cross product points, whereas the explicit cross bins are not.

To reduce the capacity overhead introduced by the synthesis of explicit cross bins and to deal with the intermediate blowup during cross bin construction, the shapes of explicit cross bins and of the entire set of implicit cross bins are represented in an optimized form as a set of disjoint hyper-rectangular ranges. Boolean operations are then defined on these range sets. The bin indicator circuits of each hyper-rectangle of an explicit bin can be synthesized as follows:

Common subexpressions can be shared between different bins.

This overhead is linear with the number of bins in the coverpoints that are crossed, rather than being polynomial of $n^{th}$ degree, where n is the dimension of the cross coverage item. For the implicit cross bins, the hyperrectangular representation is then blasted into individual cross products.

Consider the following example:
   a: coverpoint aexpr {bins a[ ]={[1:10]} };
   b: coverpoint bexpr {bins b[ ]={[1:20]} };
   c: cross a, b {
      bins c1=binsof(a) intersect {[1:3]}
         && binsof(b) intersect {[3:20]};
      bins c2=binsof(a) intersect {[4:10]}
         && binsof(b) intersect {[1:19]};
      bins c3=binsof(a) intersect {[4:7]}
         && binsof(b) intersect {20};}
Coverpoint a has 10 range bins a[1], a[2] a[10], and coverpoint b has 20 range bins b[1], b[2] . . . b[20]. The naive approach would synthesize 200 circuits—one for each cross product of a bin from coverpoint a and a bin from coverpoint b. These circuits have the form indc_i_j=inda_i & inda_j, where inda_i is the indicator circuit of bin a[i] and ind_j is the indicator circuit of bin b[j], i=1 . . . 10, j=1 . . . 20. The bin indicator circuits for the explicit cross bins c1, c2 and c3 are synthesized by disjoining the indc_i_j as appropriate.

Figure 2:
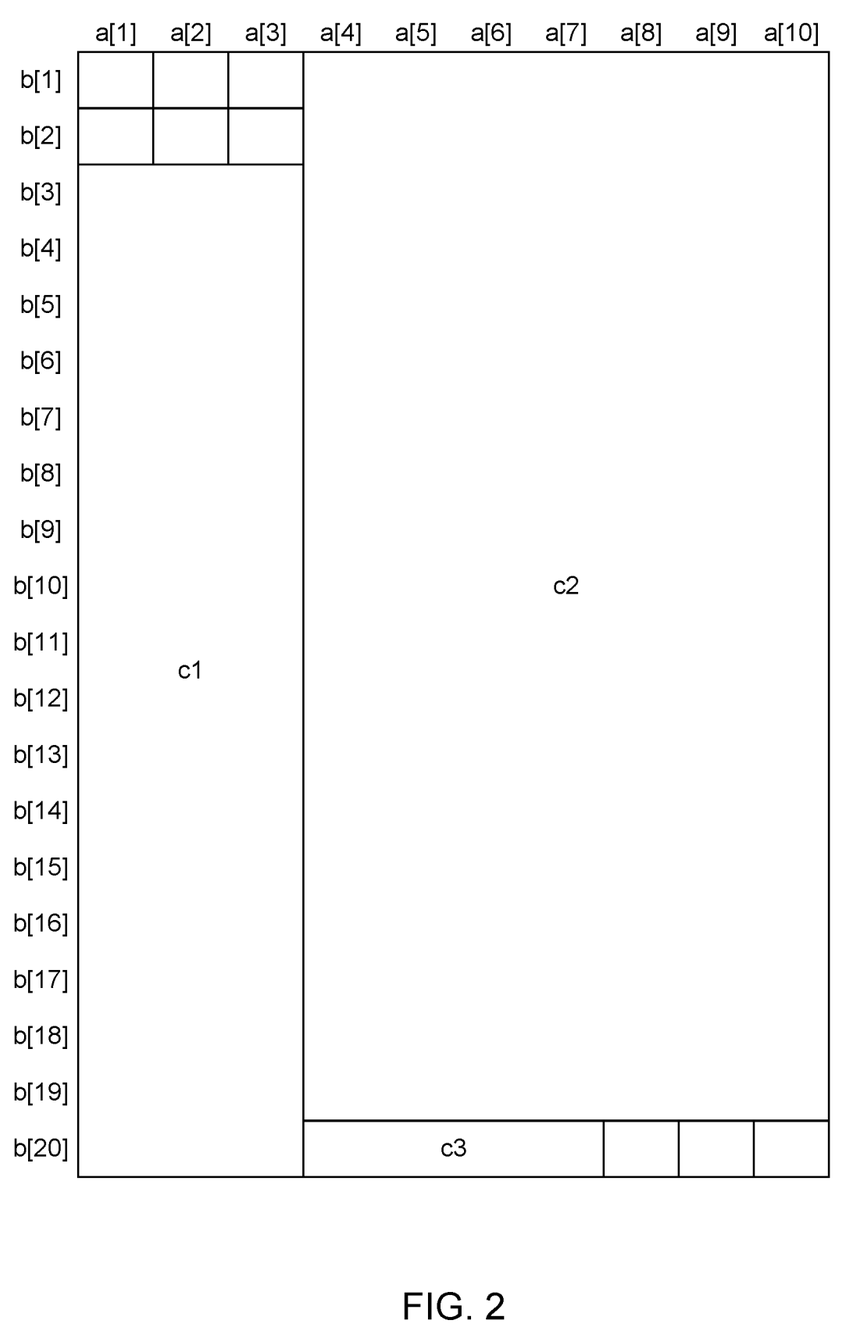
FIG. 2 is a diagram illustrating explicit and implicit cross bins for a cross coverage item.

Instead, we use the hyperrectangular representation, as shown in FIG. 2. In this figure, the horizontal axis are different range bins from coverpoint a and the vertical axis are different bins from coverpoint b. In this example, the cross coverage item is binary (i.e., a cross between two coverpoints) and, therefore, the hyperrectangles are two-dimensional rectangles. Here explicit cross bin c1 is represented as a rectangle [1:3, 3:20], explicit cross bin c2 as a rectangle [4:10, 1:19], and explicit cross bin c3 as a rectangle [20:4, 20:7]. The remaining cross products are implicit cross bins, which under the syntax are represented by individual bins: a[1]×b[1], a[1]×b[ 2], a[2]×b[1], a[2]×b[2], a[3]×b[1], a[3]×b[2], a[8]×b[20], a[9]×b[20], and a[10]×b[20]. Using this optimized form, we synthesize only 12 bin indicator circuits for all of the cross bins: one for each explicit cross bin (c1, c2, c3), and nine total for the implicit cross bins. The number of binary gates required to synthesize the logic of all explicit cross bins is 31: (20−1)+(10−1)=28 OR gates and 3 AND gates (one per explicit bin in our case). The naive approach would synthesize 200 bin indicator circuits (one per cross-product point) and 3*18+7*19+1*4=191 OR gates to combine these indicators for the explicit cross bins, let alone the in-memory representation during synthesis.

Converting Functional Coverage to Property Statements.

Figure 3:
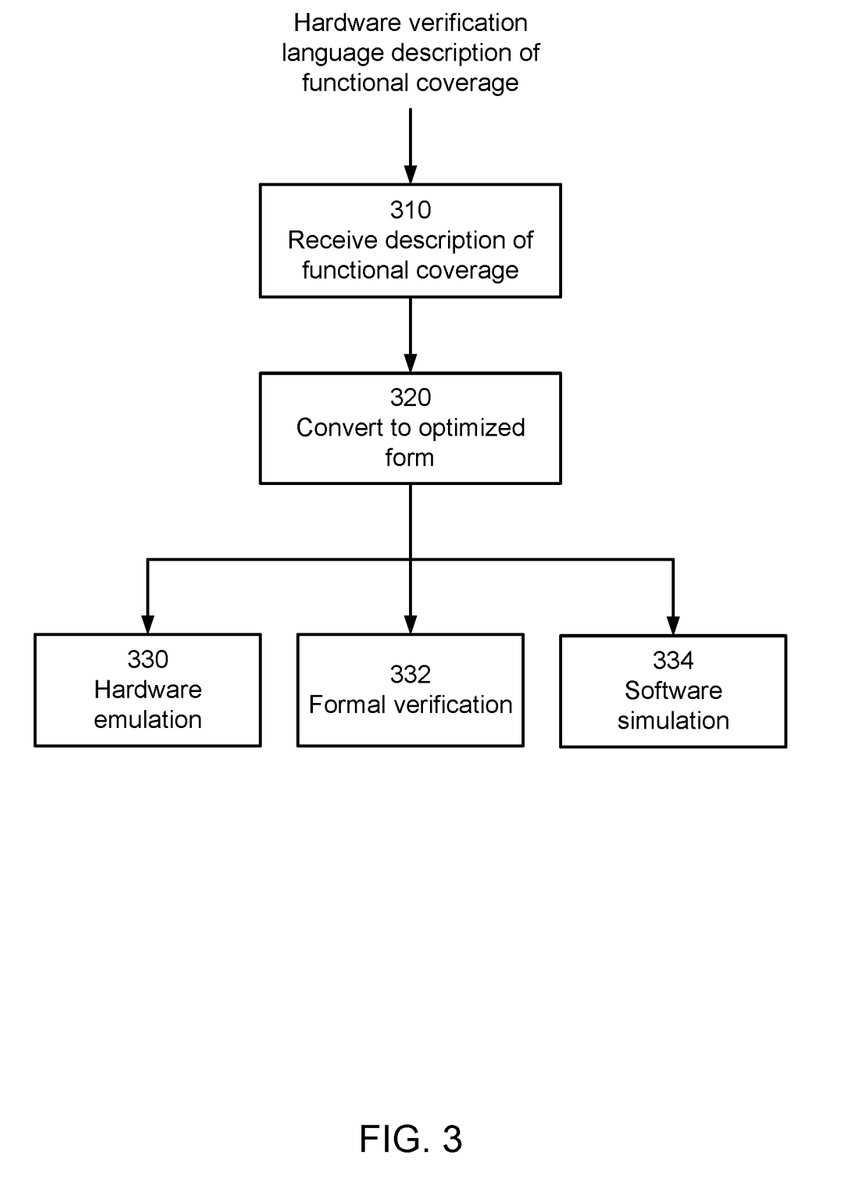
FIG. 3 is a flow diagram for optimizing representations of covergroups for use in both hardware emulation and formal verification.

Referring again to FIG. 1, in some cases the optimized form 120 involves converting the definition of the functional coverage to a cover property statement, which may then be synthesized using known techniques. In many cases, it is useful to analyze a circuit design using many different methods: hardware emulation and formal verification, for example. Property statements can be used to support all of these methods. FIG. 3 is a flow diagram for optimizing representations of functional coverage for use in both hardware emulation and formal verification. The definition of the functional coverage is provided 310 in hardware verification language. This is converted 320 from the form expressed in hardware verification language to a form that is suitable for use both in synthesis of emulation circuits for a hardware emulator and for formal verification. This form may then be used and re-used in hardware emulations 330, formal verifications 332 and/or possibly also software simulations 334. Some examples are given below.

Illegal Bins

Illegal bins specify values or transitions that are illegal. Illegal bins can be translated into assertions to alert the user when an illegal bin is hit. For example, consider

```
coverpoint cp {
    illegal_bins bad_vals = {1,2,3};
    illegal_bins bad_trans = (4=>5=>6);
}
```

This coverpoint has two illegal bins bad_vals and bad_trans, which respectively specify that the values 1, 2, 3 and the transition 4=>5=>6 are illegal. These illegal bins may be converted to a set of assert property statements:

assert property (!(cp inside {1, 2, 3});
assert property (not strong(cp inside {4} ##1 cp inside {5} ##1 cp inside {6}));

Other equivalent representations may also be used. The implied assertion clock here is the same as the covergroup clock. The strong operator keeps the assertion safety, because operator not inverts its argument strength. Transforming illegal bins into assertions allows the reduction of coverage synthesis to assertion synthesis for hardware emulation, and also allows formal verification to check whether the illegal bin is reachable. This is one way to determine whether the illegal bins themselves are hit or reachable. In addition, as described above, illegal bins may be treated the same as ignore bins to exclude illegal states or transitions from other bins.

Transition Bins

Transition bins may be translated into cover property statements. A body of each transition bin is translated into a sequence recursively as follows. A list of transition sets is translated into seq1 or . . . or seqn, where seq1 . . . seqn are subsequences corresponding to the transition sets. For example, consider the transition bin definition

```
coverpoint cp {
    bins trans = (3 => 5 => 6), ([7:9] => (11,12)[*2]);
}
```

This may be converted into the cover property cover property (set1, or set2);

where set1 and set2 are sequences synthesized for (3=>5=>6) and for ([7:9]=>(11,12) [*2]), respectively.

A transition set, which is a series of transition range lists: tr_list1=> . . . =>tr_listn is translated into seq1 ##1 . . . ##1 seqn, where seq1 . . . seqn are subsequences corresponding to the individual range lists. For the above example, (3=>5=>6) is translated into rlst1 ##1 rlst2 ##1 rlst3, and ([7:9]=>11,12 [*2]) is translated into rlst4 ##1 rlst5, where rlst1 . . . rlst5, are sequences synthesized for range lists (3), (5), (6), ([7:9]) and ((11,12) [*2]), respectively.

A transition range list is a transition item with an optional repetition range. A transition item is translated into cp inside covergroup_range_list, where cp is the coverpoint containing the transition bin, and covergroup_range_list defines a range of values. The repetition range has the same semantics in transition bins and in SVA sequences. Thus, the complete translation of the trans bin from the above example is as follows:

cover property (cp inside {3} ##1 cp inside {5} ##1 cp inside {6} or cp inside {[7:9]} ##1 cp inside {11, 12} [*2]);

The cover property clock is implied to be the same as the clocking event of the bin's covergroup.

Goto repetition ranges [-> . . . ] and nonconsecutive repetition ranges [= . . . ] may be handled in a similar way.

In the presence of an ignored sequence ign defined by ignore_bins, the cover statement for a transition bin is transformed to:

cover property (tr and not weak (ign within tr));

where tr is a sequence obtained by the transformations of the transition bin described above. The weak operator keeps cover property a safety assertion, since operator not inverts the operator strength.

If a coverpoint or a transition bin has an iff construct, say iff_cp and iff_cb, then the resulting cover property is generated as:

cover property (sync_reject_on(iff_cp || iff_cb) tr and not weak (ign within tr));

Other equivalent forms may also be used.

The above transformations of the form of the covergroup coverage relates to the internal implementation, and it can be made transparent to the user.

Clocking Events

Clocking events for assertions and coverage items (i.e., covergroups) may be synthesized into the form @$global_clock iff ce, where ce is a clock enable expression calculated as explained in F.3.1 Clock control of SystemVerilog LRM 2017, which is incorporated herein by reference. Optionally, we keep unchanged simple clocks in the form @ (posedge/negedge clk [iff ce]) where posedge/negedge indicates that either the positive edge or the negative edge may be used and the [ ] indicates that the iff ce is optional. The results of clock synthesis may be shared between coverage and SVA constructs that use them. Given a covergroup clocked by @(some_clocking_event) and another covergroup and/or a cover property statement(s) and/or other SVA statements (assertions or assumptions) clocked by the same event, this event may be synthesized just once for all these statements.

Coverage Content Optimization

Formal methods may be used to detect non-coverable bins and thus avoid their synthesis for emulation. For example, a non-coverable bin could include a bin that is trying to check that some signal may get value 1 when the value of this signal is always 0. To check the coverability, each cover bin is converted into a cover statement, as described above for transition bins and as may be extended straightforwardly to range bins. Formal verification is applied to find a witness of this cover statement. If formal verification instead proves that such a witness cannot be found, this bin is not reachable and is not synthesized, and the user is notified that this bin cannot be covered.

EDA Flow

Figure 4:
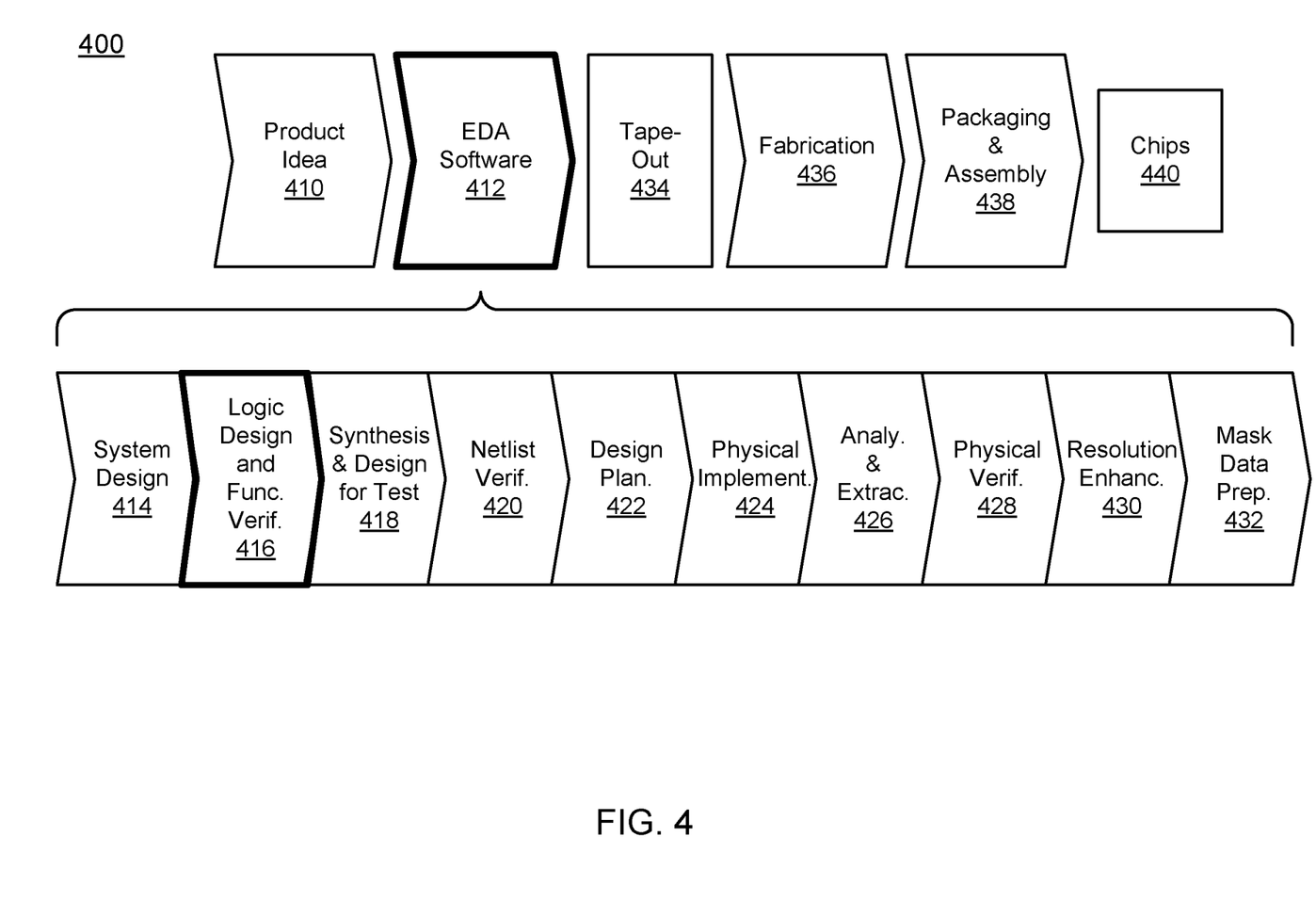
FIG. 4 is a flow diagram illustrating various operations in the design and fabrication of an integrated circuit.

FIG. 4 illustrates various processes performed in the design and fabrication of an integrated circuit using software tools with a computer to transform data and instructions that represent the integrated circuit. The processes shown above may be used in the process of FIG. 4. Specifically, some embodiments of the present disclosure can be used in EDA software 412 as a part of logic design and functional verification 416. These processes start with the generation of a product idea 410 with information supplied by a designer and is realized during a design process that uses EDA software tools 412, which may also be signified herein as EDA software, as a design tool or a verification tool. When the design is finalized, it can be taped-out 434. After tape-out, a semiconductor die is fabricated 436 and packaging and assembly processes 438 are performed, which result in the finished integrated circuit 440 which may also be signified herein as a circuit, device, component, chip or SoC (system on chip).

Note that the design process that uses EDA software tools 412 includes operations 414-432, which are described below. This design flow description is for illustration purposes only and is not meant to limit the present disclosure. For example, an actual integrated circuit design may require a designer to perform the design operations in a different sequence than the sequence described herein.

During system design 414, a designer describes the functionality to be manufactured. The designer can also perform what-if planning to refine the functionality and to check costs. Note that hardware-software architecture partitioning can occur at this stage. Exemplary EDA software products from Synopsys, Inc. of Mountain View, Calif. that can be used at this stage include: Model Architect, Saber, System Studio, and Designware products.

Then, during logic design and functional verification 416, VHDL or Verilog code for modules in the circuit is written and the design is checked for functional accuracy. More specifically, the design is checked to ensure that it produces the correct outputs. The VHDL or Verilog code is software comprising optimized readable program instructions adapted for the efficient description of a logic design. Exemplary EDA software products from Synopsys, Inc. of Mountain View, Calif. that can be used at this stage include: Spyglass, VC Static, VC Formal, VCS, Vera, Designware, Magellan, Formality, ESP and Leda products.

Functional verification 416 may be done by software simulation, formal verification and/or hardware emulation. In formal verification, the functionality of a design of an integrated circuit is tested or verified using formal proofs. The formal verification environment includes a number of properties and constraints. Known methods are used to prove or disprove the properties, subject to the given constraints, thus indicating whether the circuit design has the correct functionality. In hardware emulation, the design is implemented in hardware (on a hardware emulator) and the functionality is tested by running the hardware. In software simulation, the design is simulated in software.

Next, during synthesis and design for test 418, VHDL/Verilog code is translated to a netlist. This netlist can be optimized for the target technology. Additionally, tests can be designed and implemented to check the finished integrated circuit. Exemplary EDA software products from Synopsys, Inc. of Mountain View, Calif. that can be used at this stage include: Design Compiler, Physical Compiler, Test Compiler, Power Compiler, FPGA Compiler, Tetramax, and Designware products.

Moreover, during netlist verification 420, the netlist is checked for compliance with timing constraints and for correspondence with the VHDL/Verilog code. Exemplary EDA software products from Synopsys, Inc. of Mountain View, Calif. that can be used at this stage include: Formality, Primetime, and VCS products.

Furthermore, during design planning 422, an overall floor plan for the integrated circuit is constructed and analyzed for timing and top-level routing. Exemplary EDA software products from Synopsys, Inc. of Mountain View, Calif. that can be used at this stage include: Astro and IC Compiler products.

Additionally, during physical implementation 424, the placement positioning of circuit elements such as transistors or capacitors and routing connection of the same by a plurality of conductors occurs. Exemplary EDA software products from Synopsys, Inc. of Mountain View, Calif. that can be used at this stage include: the Astro and IC Compiler products.

Then, during analysis and extraction 426, the circuit function is verified at a transistor level, which permits refinement of the logic design. Exemplary EDA software products from Synopsys, Inc. of Mountain View, Calif. that can be used at this stage include: Astrorail, Primerail, Primetime, and Star RC/XT products.

Next, during physical verification 428, the design is checked to ensure correctness for manufacturing issues, electrical issues, lithographic issues, and circuitry. Exemplary EDA software products from Synopsys, Inc. of Mountain View, Calif. that can be used at this stage include the Hercules product.

Moreover, during resolution enhancement 430, geometric manipulations of the layout are performed to improve manufacturability of the design. Exemplary EDA software products from Synopsys, Inc. of Mountain View, Calif. that can be used at this stage include: Proteus, Proteus, and PSMGED products.

Additionally, during mask-data preparation 432, the 'tape-out' data for production of masks to produce finished integrated circuits is provided. Exemplary EDA software products from Synopsys, Inc. of Mountain View, Calif. that can be used at this stage include the Cats. family of products.

For all of the above mentioned integrated circuit design tools, similar tools from other EDA vendors, such as Cadence and Mentor Graphics, can be used as an alternative. Additionally, similarly non-commercial tools available from universities can be used.

A storage subsystem is preferably used to store the basic programming and data constructs that provide the functionality of some or all of the EDA tools described herein, and tools applied for development of cells for the library and for physical and logical design using the library. These software modules are generally executed by one or more processors in a manner known to those of ordinary skill in the art.

Figure 5:
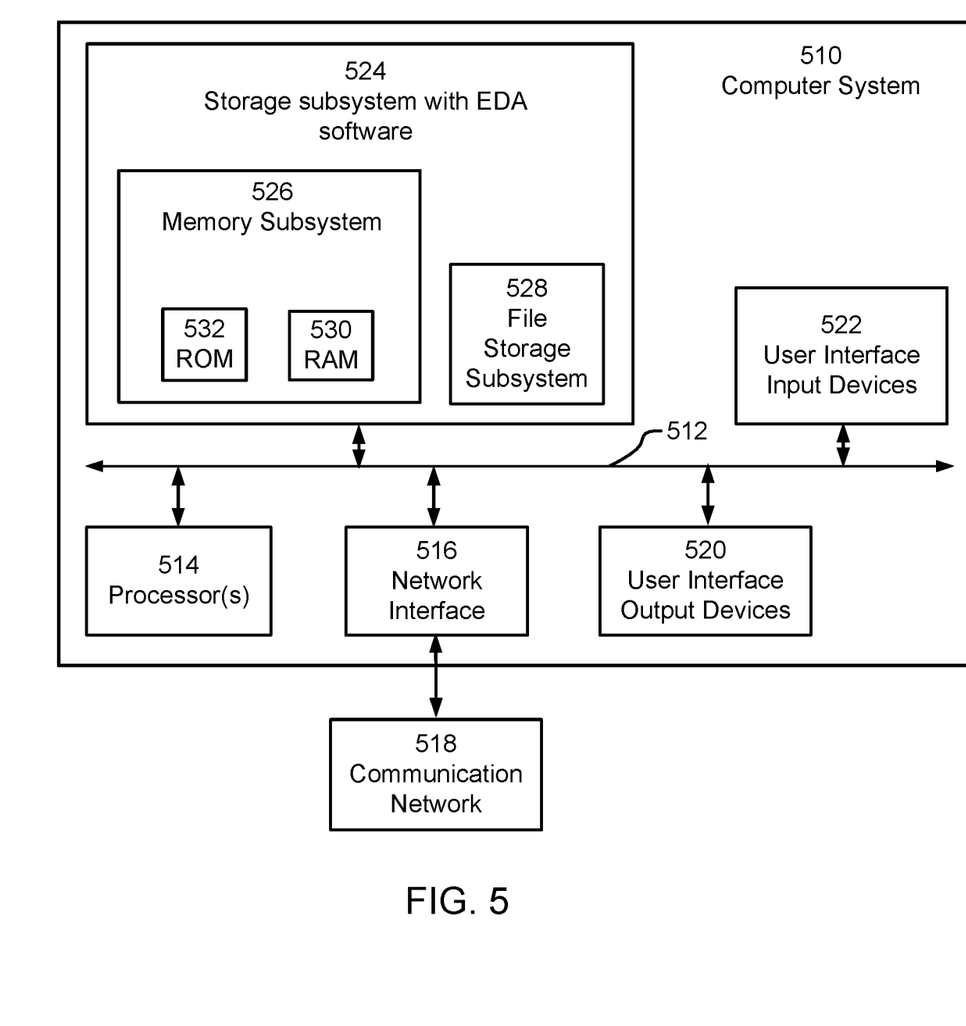
FIG. 5 is a block diagram of one embodiment of a computer system that may be used with the present invention.

FIG. 5 is a block diagram of one embodiment of a computer system 510 that may be used with the present invention. The computer system 510 typically includes at least one computer or processor 514 which communicates with a number of peripheral devices via bus subsystem 512. Typically, the computer can include, or the processor can be, any of a microprocessor, graphics processing unit, or digital signal processor, and their electronic processing equivalents, such as an Application Specific Integrated Circuit (ASIC) or Field Programmable Gate Array (FPGA). The terms "processor" and "computer" are further defined below. These peripheral devices may include a storage subsystem 524, comprising a memory subsystem 526 and a file storage subsystem 528, user interface input devices 522, user interface output devices 520, and a network interface subsystem 516. The input and output devices allow user interaction with computer system 510.

The computer system may be a server computer, a client computer, a workstation, a mainframe, a personal computer (PC), a tablet PC, a rack-mounted "blade" or any data processing machine capable of executing instructions (sequential or otherwise) that specify actions to be taken by that machine.

The computer system typically includes an operating system, such as Microsoft's Windows, Sun Microsystems's Solaris, Apple Computer's MacOs, Linux or Unix. The computer system also typically can include a Basic Input/Output System (BIOS) and processor firmware. The operating system, BIOS and firmware are used by the processor to control subsystems and interfaces connected to the processor. Typical processors compatible with these operating systems include the Pentium and Itanium from Intel, the Opteron and Athlon from Advanced Micro Devices, and the ARM processor from ARM Holdings.

Innovations, embodiments and/or examples of the claimed inventions are neither limited to conventional computer applications nor the programmable apparatus that run them. For example, the innovations, embodiments and/or examples of what is claimed can include an optical computer, quantum computer, analog computer, or the like. The computer system may be a multi-processor or multi-core system and may use or be implemented in a distributed or remote system. The term "processor" here is used in the broadest sense to include a singular processor and multi-core or multi-processor arrays, including graphic processing units, digital signal processors, digital processors and combinations of these devices. Further, while only a single computer system or a single machine may be illustrated, the use of a singular form of such terms shall also signify any collection of computer systems or machines that individually or jointly execute instructions to perform any one or more of the operations discussed herein. Due to the ever-changing nature of computers and networks, the description of computer system 510 depicted in FIG. 5 is intended only as one example for purposes of illustrating the preferred embodiments. Many other configurations of computer system 510 are possible having more or less components than the computer system depicted in FIG. 5.

Network interface subsystem 516 provides an interface to outside networks, including an interface to communication network 518, and is coupled via communication network 518 to corresponding interface devices in other computer systems or machines. Communication network 518 may comprise many interconnected computer systems, machines and communication links. These communication links may be wireline links, optical links, wireless links, or any other devices for communication of information. Communication network 518 can be any suitable computer network, for example a wide area network such as the Internet, and/or a local area network such as Ethernet. The communication network can be wired and/or wireless, and the communication network can use encryption and decryption methods, such as is available with a virtual private network. The communication network uses one or more communications interfaces, which can receive data from, and transmit data to, other systems. Embodiments of communications interfaces typically include an Ethernet card, a modem (e.g., telephone, satellite, cable, or ISDN), (asynchronous) digital subscriber line (DSL) unit, Firewire interface, USB interface, and the like. One or more communications protocols can be used, such as HTTP, TCP/IP, RTP/RTSP, IPX and/or UDP.

User interface input devices 522 may include an alphanumeric keyboard, a keypad, pointing devices such as a mouse, trackball, touchpad, stylus, or graphics tablet, a scanner, a touchscreen incorporated into the display, audio input devices such as voice recognition systems or microphones, eye-gaze recognition, brainwave pattern recognition, and other types of input devices. Such devices can be connected by wire or wirelessly to a computer system. In general, use of the term "input device" is intended to include all possible types of devices and ways to input information into computer system 510 or onto communication network 518. User interface input devices typically allow a user to select objects, icons, text and the like that appear on some types of user interface output devices, for example, a display subsystem.

User interface output devices 520 may include a display subsystem, a printer, or non-visual displays such as audio output devices. The display subsystem may include a flat-panel device such as a liquid crystal display (LCD), a projection device, or some other device for creating a visible image such as a virtual reality system. The display subsystem may also provide non-visual display such as via audio output or tactile output (e.g., vibrations) devices. In general, use of the term "output device" is intended to include all possible types of devices and ways to output information from computer system 510 to the user or to another machine or computer system.

Memory subsystem 526 typically includes a number of memories including a main random-access memory (RAM) 530 (or other volatile storage device) for storage of instructions and data during program execution and a read only memory (ROM) 532 in which fixed instructions are stored. File storage subsystem 528 provides persistent storage for program and data files, and may include a hard disk drive, a floppy disk drive along with associated removable media, a CD-ROM drive, an optical drive, a flash memory, or removable media cartridges. The databases and modules implementing the functionality of certain embodiments may be stored by file storage subsystem 528.

Bus subsystem 512 provides a device for letting the various components and subsystems of computer system 510 communicate with each other as intended. Although bus subsystem 512 is shown schematically as a single bus, alternative embodiments of the bus subsystem may use multiple busses. For example, RAM-based main memory can communicate directly with file storage systems using Direct Memory Access (DMA) systems.

As used herein, the term "module" signifies a tangible data and information processing device, that typically is limited in size and/or complexity. For example, the term "module" can signify one or more methods or procedures that can transform data and information. The term "module" can also signify a combination of one or more methods and procedures in a computer program. The term "module" can also signify a small network of digital logic devices, in which interconnections of the logic devices give structure to the network. Methods and procedures comprising a module, specified in a specialized language, such as System C, can be used to generate a specification for a network of digital logic devices that process data and information with exactly the same results as are obtained from the methods and procedures.

A module can be permanently configured (e.g., hardwired to form hardware), temporarily configured (e.g., programmed with software), or a combination of the two configurations (for example, a structured ASIC). Permanently configured modules can be manufactured, for example, using Application Specific Integrated Circuits (ASICs) such as Arithmetic Logic Units (ALUs), Programmable Logic Arrays (PLAs), or Read Only Memories (ROMs), all of which are typically configured during manufacturing. Temporarily configured modules can be manufactured, for example, using Field Programmable Gate Arrays (FPGAs—for example, sold by Xilink or Inters Altera), Random Access Memories (RAMs) or microprocessors. A module is configured to process data and information, typically using a sequence transformations (also referred to as "operations") applied to the data and information (or in the case of ROMs and RAMS, transforming data and information by using the input information as an address for memory that stores output data and information), to perform aspects of the present innovations, embodiments and/or examples of the invention.

Modules that are temporarily configured need not be configured at any one instance in time. For example, a processor comprising one or more modules can have the modules configured at different times. The processor can comprise a set of one or more modules at one instance of time, and to comprise a different set of one or modules at a different instance of time. The decision to manufacture or implement a module in a permanently configured form, a temporarily configured form, or a combination of the two forms, may be driven by cost, time considerations, engineering constraints and/or specific design goals. The "substance" of a module's processing is independent of the form in which it is manufactured or implemented.

As used herein, the term "algorithm" signifies a process comprising a sequence or set of operations or instructions that a module can use to transform data and information to achieve a result. A module can comprise one or more algorithms. As used herein, the term "thread" refers to a sequence of instructions that can comprise a subset of the instructions of an entire process or algorithm. A process or algorithm can be partitioned into multiple threads that can be executed in parallel.

As used herein, the term "computer" includes at least one information processor that, for example, can perform certain operations such as (but not limited to) the AND, OR and NOT logical operations using electronic gates that can comprise transistors, with the addition of memory (for example, memory based on flip-flops using the NOT-AND or NOT-OR operation). Such a processor is said to be Turing-complete or computationally universal. A computer, whether or not it is a digital computer, typically comprises many modules.

As used herein, the term "software" or "program" signifies one or more algorithms and data structures that configure a processor for use in the innovations, embodiments and examples described in this specification. Such devices configurable by software include one or more computers, for example, standalone, client or server computers, or one or more hardware modules, or systems of one or more such computers or modules. As used herein, the term "software application" signifies a set of data and instructions that configure the processor to achieve a specific result, for example, to perform word processing operations, or to encrypt a set of data.

As used herein, the term "programming language" signifies a grammar and syntax for specifying sets of instruction and data that comprise software. Programming languages include assembler instructions, instruction-set-architecture (ISA) instructions, machine instructions, machine dependent instructions, microcode, firmware instructions, state-setting data, or either source code or object code written in any combination of one or more higher level languages, such as conventional procedural programming languages, for example, the "C" programming language or similar programming languages (such as SystemC), or object oriented programming language such as Smalltalk, C++ or the like, and any future equivalent programming languages.

Software is entered into, equivalently, read into, one or memories of the computer or computer system from a data and information storage device. The computer typically has a device for reading storage media that is used to transport the software, or has an interface device that receives the software over a network.

Although the detailed description contains many specifics, these should not be construed as limiting the scope of the invention but merely as illustrating different examples. It should be appreciated that the scope of the disclosure includes other embodiments not discussed in detail above. Various other modifications, changes and variations which will be apparent to those skilled in the art may be made in the arrangement, operation and details of the method and apparatus disclosed herein without departing from the spirit and scope as defined in the appended claims. Therefore, the scope of the invention should be determined by the appended claims and their legal equivalents.

What is claimed is:

1. A method implemented on a computer system executing instructions for synthesizing functional coverage as an emulation circuit, the method comprising:
   accessing a definition of a functional coverage of a digital circuit of interest, the definition expressed in a hardware verification language and including a group of one or more coverpoints for integral expressions of signals in the digital circuit, each coverpoint including a group of one or more bins that specify a set of values or transitions of the integral expression covered by that coverpoint;
   determining whether the set of values or transitions specified in the bins is not reachable by hardware emulation; and
   excluding those bins for which the set of values or transitions specified in the bins is determined to be not reachable by hardware emulation, synthesizing the bins as corresponding bin indicator circuits, the bin indicator circuits suitable for implementation as part of an emulation circuit on a hardware emulator, the emulation circuit implementing the functional coverage on the hardware emulator, and each bin indicator circuit producing an output that indicates whether the corresponding bin is active during hardware emulation, wherein synthesizing the bins comprises:
      converting the definition of the functional coverage as expressed in the hardware verification language to a form that is synthesizable; and
      synthesizing the bins as the corresponding bin indicator circuits from the synthesizable form.

2. The computer-implemented method of claim 1 wherein the coverpoints for integral expressions of signals include coverpoints for individual signals.

3. The computer-implemented method of claim 1 further comprising:
   synthesizing counters for the bin indicator circuits.

4. A method implemented on a computer system executing instructions for synthesizing functional coverage as an emulation circuit, the method comprising:
   accessing a definition of a functional coverage of a digital circuit of interest, the definition expressed in a hardware verification language and including a group of one or more coverpoints for integral expressions of signals in the digital circuit, each coverpoint including a group of one or more bins that specify a set of values or transitions of the integral expression covered by that coverpoint; and
   synthesizing the bins as corresponding bin indicator circuits, the bin indicator circuits suitable for implementation as part of an emulation circuit on a hardware emulator, the emulation circuit implementing the functional coverage on the hardware emulator, and each bin indicator circuit producing an output that indicates whether the corresponding bin is active during hardware emulation;
   wherein the definition of the functional coverage includes an illegal bin defining illegal values or illegal transitions of the integral expression; and synthesizing the illegal bin as the corresponding bin indicator circuit comprises:
      converting the definition of the functional coverage representing the illegal bin to an assert property statement; and
      synthesizing the illegal bin as the corresponding bin indicator circuit from the assert property statement.

5. A method implemented on a computer system executing instructions for synthesizing functional coverage as an emulation circuit, the method comprising:
   accessing a definition of a functional coverage of a digital circuit of interest, the definition expressed in a hardware verification language and including a group of one or more coverpoints for integral expressions of signals in the digital circuit, each coverpoint including a group of one or more bins that specify a set of values or transitions of the integral expression covered by that coverpoint; and
   synthesizing the bins as corresponding bin indicator circuits, the bin indicator circuits suitable for implementation as part of an emulation circuit on a hardware emulator, the emulation circuit implementing the functional coverage on the hardware emulator, and each bin indicator circuit producing an output that indicates whether the corresponding bin is active during hardware emulation, wherein synthesizing the bins comprises:
      converting the definition of the functional coverage representing one of the bins to a cover property statement, wherein the cover property statement is both suitable for synthesis as the corresponding bin indicator circuit and suitable for use in formal verification; and
      synthesizing said bin as the corresponding bin indicator circuit from the cover property statement.

6. The computer-implemented method of claim 5 wherein:
   at least one of the bins is a transition bin that specifies a set of one or more transitions of the integral expression to be covered for the coverpoint containing the transition bin; and
   synthesizing the transition bin as the corresponding bin indicator circuit comprises:
      converting the definition of the functional coverage representing the transition bin to a set of cover property statements; and
      synthesizing the transition bin as the corresponding bin indicator circuit from the set of cover property statements.

7. The computer-implemented method of claim 5 wherein:
   at least one of the bins is a range bin that specifies a set of values of the integral expression to be covered for the coverpoint containing the range bin; and
   synthesizing the range bin comprises:
      transforming the set of values specified in the range bin to a form that is synthesizable; and
      synthesizing the range bin as the corresponding bin indicator circuit from the synthesizable form.

8. The computer-implemented method of claim 7 wherein:
   adjacent and/or overlapping ranges of values specified in the range bin are merged in the synthesizable form; and
   synthesizing the range bin comprises synthesizing a circuit for the merged range of values.

9. The computer-implemented method of claim 7 wherein transforming the set of values specified in the range bin to the synthesizable form comprises applying interval tree logic to the set of values specified in the range bin to derive the synthesizable form.

10. The computer-implemented method of claim 7 wherein:
    ignored and/or illegal values are removed from the synthesizable form of the range bin; and no circuit is synthesized for the removed values in the synthesis of the range bin.

11. The computer-implemented method of claim 7 wherein:
the range bin is removed in the synthesizable form, if the set of values specified in the range bin is an empty set; and
no bin indicator circuit is synthesized for the removed range bin.

12. The computer-implemented method of claim 11 wherein:
the definition of the functional coverage also includes a range bin or an ignore bin or an illegal bin defined using wildcards; and
transforming the set of values specified in the range bin to the synthesizable form comprises applying formal analysis to determine whether the set of values specified in the range bin is the empty set after removing the values specified in the ignore bin.

13. The computer-implemented method of claim 5 wherein:
the definition of the functional coverage also includes at least one cross coverage item that includes a group of one or more cross bins that cover cross products between two or more coverpoints; and
synthesizing the group of cross bins comprises:
converting the group of cross bins to a form that is synthesizable; and
synthesizing the group of cross bins as the corresponding bin indicator circuits from the synthesizable form.

14. The computer-implemented method of claim 3 wherein:
the definition of the cross coverage item expressed in the hardware verification language includes a definition of one or more explicit cross bins; and
in the synthesizable form, no bin indicator circuits are synthesized for individual cross product points within the explicit cross bins.

15. The computer-implemented method of claim 3 wherein converting the group of cross bins to the synthesizable form comprises applying hyperrectangular range set algebra to the cross products between two or more coverpoints to derive the synthesizable form.

16. The computer-implemented method of claim 5 wherein the functional coverage of the digital circuit of interest is specified by coverage items and cover property statements based on a same clocking event, the method further comprising:
performing a single synthesis of a clock circuit for the clocking event for the coverage items and the cover property statements, rather than re-synthesizing the same clocking event separately for individual coverage items and cover property statements.

17. The computer-implemented method of claim 5 wherein synthesizing the bins in the synthesizable form as corresponding bin indicator circuits comprises:
determining whether the set of values or transitions specified in the bins is an empty set; and
not synthesizing bins for which the set of values or transitions specified in the bins is determined to be the empty set.

* * * * *